(12) United States Patent
Fujii (10) Patent No.: US 6,176,968 B1
(45) Date of Patent: *Jan. 23, 2001

(54) METHOD AND APPARATUS FOR PRODUCING SEMICONDUCTOR LASER DEVICE

(75) Inventor: Yoshihisa Fujii, Nara (JP)

(73) Assignee: Sharp Kabushiki Kaisha, Osaka (JP)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/190,242

(22) Filed: Nov. 13, 1998

Related U.S. Application Data (62) Division of application No. 08/703,042, filed on Aug. 26, 1996, now Pat. No. 5,872,020.

(30) Foreign Application Priority Data

Sep. 8, 1995 (JP) .................................... 7-231778

(51) Int. Cl.[7] .............................. C23C 16/00; C23F 1/02
(52) U.S. Cl. ......................... 156/345; 118/731; 118/719
(58) Field of Search .................................. 118/719, 731; 156/345; 414/935, 936, 404, 810

(56) References Cited

U.S. PATENT DOCUMENTS

| | | | |
|---|---|---|---|
| 4,244,673 | * | 1/1981 | Henderson ........................... 414/405 |
| 5,138,973 | * | 8/1992 | Davis et al. .................. 118/723 MP |
| 5,180,685 | * | 1/1993 | Yamamoto et al. . |
| 5,286,296 | * | 2/1994 | Sato et al. ............................. 118/719 |
| 5,421,889 | * | 6/1995 | Pollock et al. ....................... 118/719 |
| 5,474,641 | * | 12/1995 | Otsuki et al. ......................... 156/345 |
| 5,541,139 | * | 7/1996 | Rijpers et al. . |
| 5,571,750 | * | 11/1996 | Watanabe et al. . |
| 5,985,032 | * | 11/1999 | Eriguchi .............................. 156/345 |

FOREIGN PATENT DOCUMENTS 6-296059 * 10/1994 (JP) .

OTHER PUBLICATIONS

"Silicon Processing for The VLSI Era", Process Technology, vol. 1 (S. Wolf et al), pp. 539–556 (1986).*
"Cost Reduction of Semiconductor Laser", OPTICS, vol. 24, No. 5, May, 1995 (H. Matagi), pp. 295–296.*
Patent Abstracts of Japan, vol. 013, No. 468 (E–834), Oct. 23, 1989 and JP–A–01 183181 (Fujitsu Ltd), Jul. 20, 1989, Summary.*
Patent Abstracts of Japan, vol. 009, No. 230 (E–343), Sep. 17, 1985 and JP–A–60 085586 (Sony KK), May 15, 1985, Summary.*
Patent Abstracts of Japan, vol. 007, No. 236 (E–205), Oct. 20, 1983 and JP–A–58 125887 (Hitachi Seisakusho KK), Jul. 27, 1983, Summary.*
Patent Abstracts of Japan, vol. 015, No. 454 (E–1135), Nov. 19, 1991 and JP–A–03 195071 (Hikari Gijutsu Kenkyu Kaihatsu KK), Aug. 26, 1991, Summary.*
Patent Abstracts of Japan, vol. 017, No. 110 (E–1329), Mar. 8, 1993 and JP–A–04 294589 (Sumitumo Electric Ind Ltd), Oct. 19, 1992, Summary.*

* cited by examiner

*Primary Examiner*—Gregory Mills
*Assistant Examiner*—Sylvia R. MacArthur
(74) *Attorney, Agent, or Firm*—Nixon & Vanderhye P.C.

(57) ABSTRACT

A method for producing a semiconductor laser device includes the steps of: forming a reflection protective film on a light-emitting facet of a semiconductor laser device; and removing an unwanted reflection protective film formed on a portion other than the light-emitting facet by an etching technique. Furthermore, an apparatus for producing a semiconductor laser device, includes: a formation section forming a reflection protective film on a light-emitting facet of a semiconductor laser device; an etching section removing an unwanted reflection protective film formed on a portion other than the light-emitting facet by an etching technique; a device inverting section turning the semiconductor laser device upside down; and a device transferring section transferring the semiconductor laser device among the formation section, the etching section, and the device inverting section in a predetermined order.

5 Claims, 6 Drawing Sheets

Prior Art

FIG.5B

Prior Art

FIG. 6

Prior Art

METHOD AND APPARATUS FOR PRODUCING SEMICONDUCTOR LASER DEVICE

This is a division of application Ser. No. 08/703,042, filed Aug. 26, 1996, now U.S. Pat. No. 5,872,020.

BACKGROUND OF THE INVENTION

1. Field of the Invention

The present invention relates to a method for producing a semiconductor laser device with a reflection protective film formed on a light-emitting facet thereof, used for an optical pickup or the like in an apparatus such as a CD player and an MD player, and an apparatus for producing the same.

2. Description of the Related Art

In recent years, semiconductor laser devices used for optical pickups of CD players and MD players are in increasing demand. In particular, highly reliable semiconductor laser devices with less variations in lasing characteristics have been demanded. In order to supply such good quality semiconductor laser devices at a low cost, they are required to be mass-produced with a high yield.

Conventionally, in a practical semiconductor laser device, a single thin film made of silicon nitride, alumina, silicon, or $Al_xGa_{1-x}As$ crystal is formed, or these thin films are layered, on a light-emitting facet, whereby a reflection protective film is formed so as to adjust the reflectance of the light-emitting facet to a desired value. Such a reflection protective film improves lasing characteristics such as a threshold current for laser oscillation, and prevents the light-emitting facet from degrading or being damaged, thereby ensuring the reliability of the semiconductor laser device for a long period of time. (In this application, such a film which has functions of adjusting the reflectance of the light-emitting facet as well as protecting the light-emitting facet is called the "reflection protective film".) However, it is difficult to form a desired reflection protective film on a semiconductor wafer because the reflection protective film is required to be formed on a facet of each semiconductor laser device.

Figure 5A:
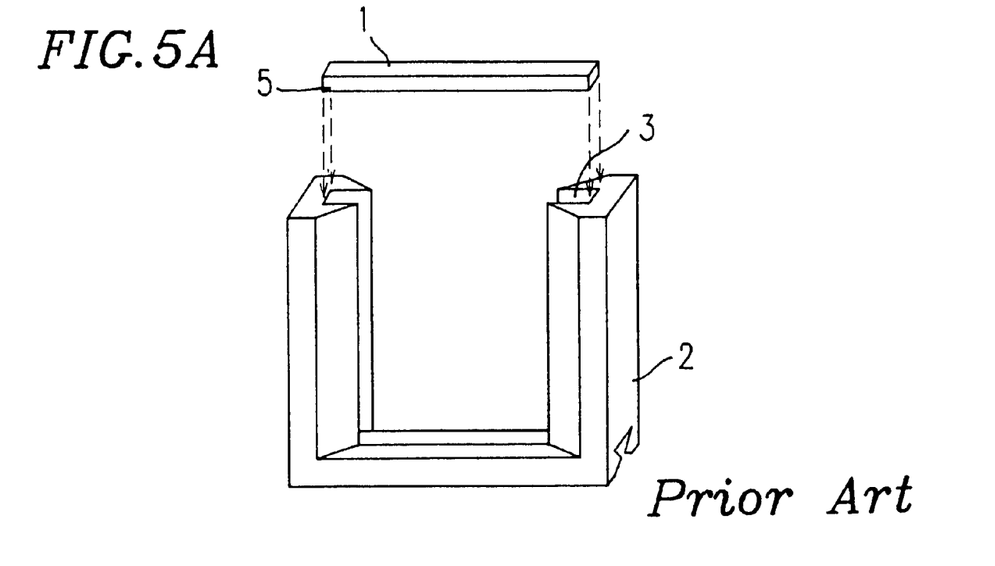
FIGS. 5A and 5B are views respectively illustrating steps of forming a reflection protective film on a facet of a semiconductor laser device according to a conventional method for producing a semiconductor laser device.
Figure 5B:
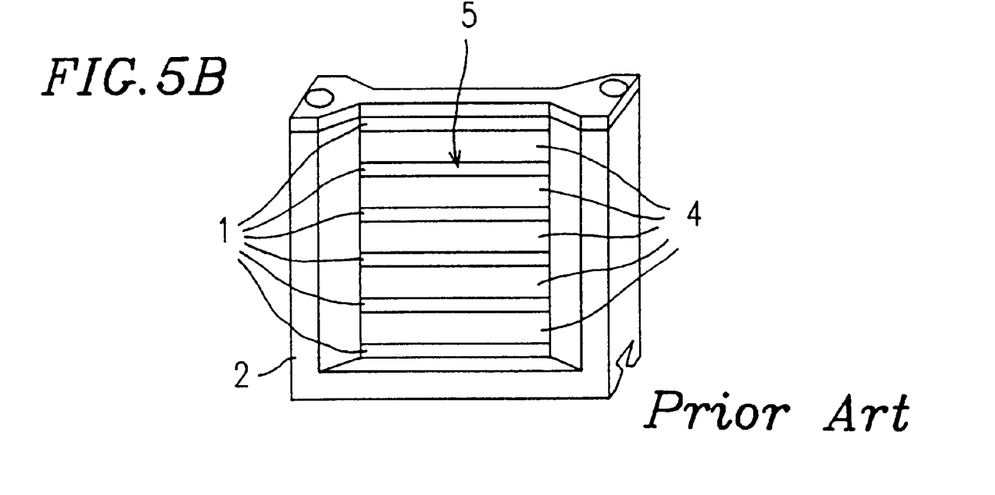

A method for forming the above-mentioned reflection protective film is disclosed, for example, in Japanese Laid-Open Patent Publication No. 6-296059. According to this method, as shown in FIGS. 5A and 5B, a wafer is cleaved to form a plurality of bar wafers 1 having a predetermined cavity length. The bar wafers 1 are inserted into a groove 3 of a jig 2 in the thickness direction so as to be fixed in the jig 2. At this time, partitioning members 4 are inserted between the respective bar wafers 1 so that the bar wafers 1 do not come into contact with each other. Thereafter, a reflection protective film is formed on each light-emitting facet 5 (cleavage facet) of the bar wafers 1 exposed from the jig 2.

According to the above-mentioned conventional method, it takes a long time to fix the bar wafers 1 in the jig 2 by inserting them into the groove 3 thereof, and automation of the inserting process is very difficult to achieve. Furthermore, the bar wafers 1 are actually inserted into the groove 3 by holding side surfaces, i.e., the light-emitting facets 5 thereof, with a pincette, which may damage the light-emitting facets 5. The bar wafers 1 may also be broken when being fixed in the jig 2. When gaps are present between the bar wafers 1 and the partitioning members 4 when fixed in the jig 2, there is a possibility that the reflection protective film adheres to electrodes formed on the top and bottom surfaces of the bar wafers 1 as well as the light-emitting facets 5. These factors make it difficult to improve the production yield of this method.

Figure 6:
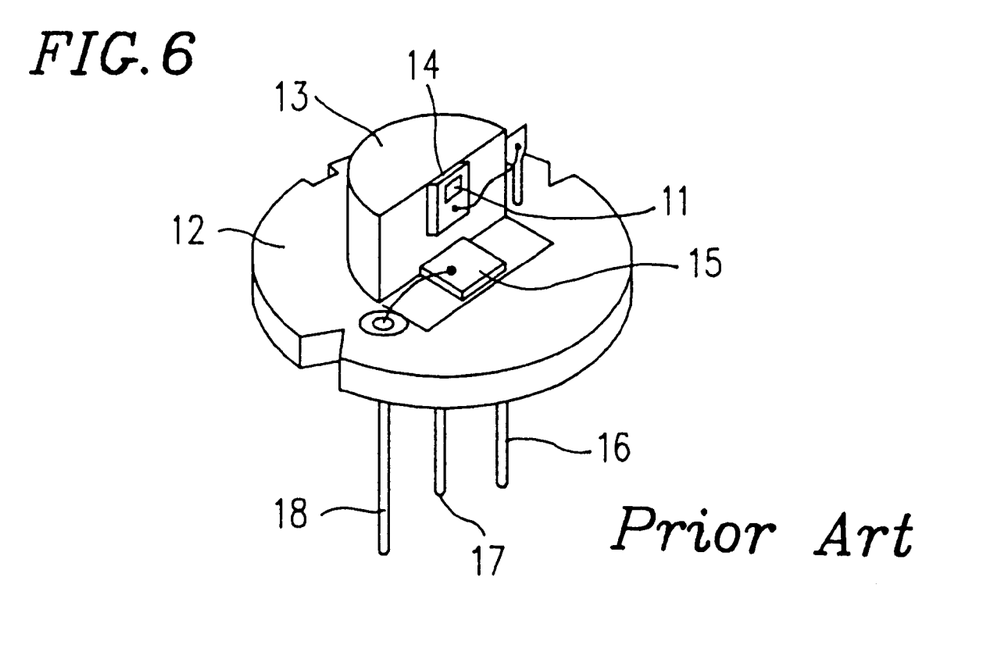
FIG. 6 is a view illustrating a step of forming a reflection protective film on a facet of a semiconductor laser device according to another conventional method for producing a semiconductor laser device.

A method for forming a reflection protective film on respective facets after a wafer is cleaved to individual semiconductor laser devices (chips) is disclosed in, for example, "Cost Reduction of Semiconductor Laser" H. Matagi, Optics, Vol. 24, No. 5, pp. 295–296 (May, 1995). According to this method, as shown in FIG. 6, a semiconductor laser chip 11 is die-bonded to a stem 12, having three leads 16, 17, and 18, via a heat sink 13 and a submount 14. A PIN photodiode (PIN-PD) 15 is mounted on the stem 12. The stem 12 is introduced into a protective film forming machine one by one after the semiconductor laser chip 11 is connected to the lead 16 and the PIN-PD 15 is wire-bonded to the lead 18, whereby a reflection protective film is formed on a facet of the semiconductor laser chip 11.

In the above-mentioned conventional method, the reflection protective film is formed on each facet of the semiconductor laser chips 11 after being cleaved from a wafer and die-bonded to the stem 12. Therefore, die-bonding and wire-bonding are conducted between the step of cleaving a wafer to the individual semiconductor laser chips 11 and the step of forming the reflection protective film on each facet of the semiconductor laser chips 11. During this period, undesired phenomena such as the damage of a light-emitting facet and the formation of an unwanted oxide layer on the light-emitting facet are likely to occur, causing the malfunction and decrease in reliability of the semiconductor laser chips 11. Furthermore, since the formation process of the reflection protective films are successively conducted with respect to the individual stems 12 provided with the semiconductor laser chips 11, a very large apparatus is required for simultaneously forming the reflection protective films on the facets of a number of semiconductor laser chips 11. This contributes to the prevention of mass production and cost reduction.

SUMMARY OF THE INVENTION

According to the present invention, a method for producing a semiconductor laser device includes the steps of: forming a reflection protective film on a light-emitting facet of a semiconductor laser device; and removing an unwanted reflection protective film formed on a portion other than the light-emitting facet by an etching technique.

In one embodiment of the present invention, an anisotropic dry etching technique is used as the etching technique in the removal step.

In another embodiment of the present invention, a reactive ion etching technique using $CF_4$ gas is used as the etching technique in the removal step.

According to the present invention, an apparatus for producing a semiconductor laser device includes: a formation section forming a reflection protective film on a light-emitting facet of a semiconductor laser device; an etching section removing an unwanted reflection protective film formed on a portion other than the light-emitting facet by an etching technique; a device inverting section turning the semiconductor laser device upside down; and a device transferring section transferring the semiconductor laser device among the formation section, the etching section, and the device inverting section in a predetermined order.

According to the method for producing a semiconductor laser device of the present invention, a reflection protective film can be formed on a facet which is a light-emitting facet of a semiconductor laser device immediately after the facet is formed by dividing a wafer into a plurality of bar wafers. In addition, an unwanted protective film adhering to an inappropriate portion can be removed by etching during the subsequent step. As a result, the reliability of the semiconductor laser device can be prevented from decreasing due to the damage of the light-emitting facet and the formation of an oxide layer on the light-emitting facet, which has been impossible according to the conventional method. Furthermore, the production yield improves and the processing steps can be easily automated.

The apparatus for producing a semiconductor laser device of the present invention makes it unnecessary to place bar wafers in a groove of a jig, which is required in the conventional method. The apparatus makes it possible to process a bar wafer which is smaller in size than a stem. This easily results in automation of processing steps and mass-production of semiconductor laser devices, which is difficult to achieve in the conventional technique. Thus, the apparatus enables semiconductor laser devices to be produced in a shorter period of time than the conventional technique.

When an anisotropic etching technique using dry etching is employed for removing the unwanted reflection protective films adhering to the electrodes of the semiconductor laser devices, the reflection protective films formed on the light-emitting facets of the semiconductor laser devices are hardly etched away even without using a mask. Thus, it becomes possible to remove only the unwanted reflection protective films on the electrodes.

Thus, the invention described herein makes possible the advantages of (1) providing a method for producing a semiconductor laser device in which a light-emitting facet is prevented from being damaged and an unwanted oxide layer is prevented from being formed to improve production yield while keeping high reliability, and a number of chips can be automatically produced in a short period of time; and (2) providing an apparatus for producing a semiconductor laser device using the method.

These and other advantages of the present invention will become apparent to those skilled in the art upon reading and understanding the following detailed description with reference to the accompanying figures.

DESCRIPTION OF THE PREFERRED EMBODIMENTS

Hereinafter, the embodiments of the present invention will be described with reference to the attached drawings.

Embodiment 1

In the present embodiment, silicon nitride is used as a material for a reflection protective film formed on a light-emitting facet of a semiconductor laser device. Unwanted reflection protective films adhering to the top surface and the bottom surface of the semiconductor laser device are removed by a dry etching method using $CF_4$ gas and $O_2$ gas.

Figure 1:
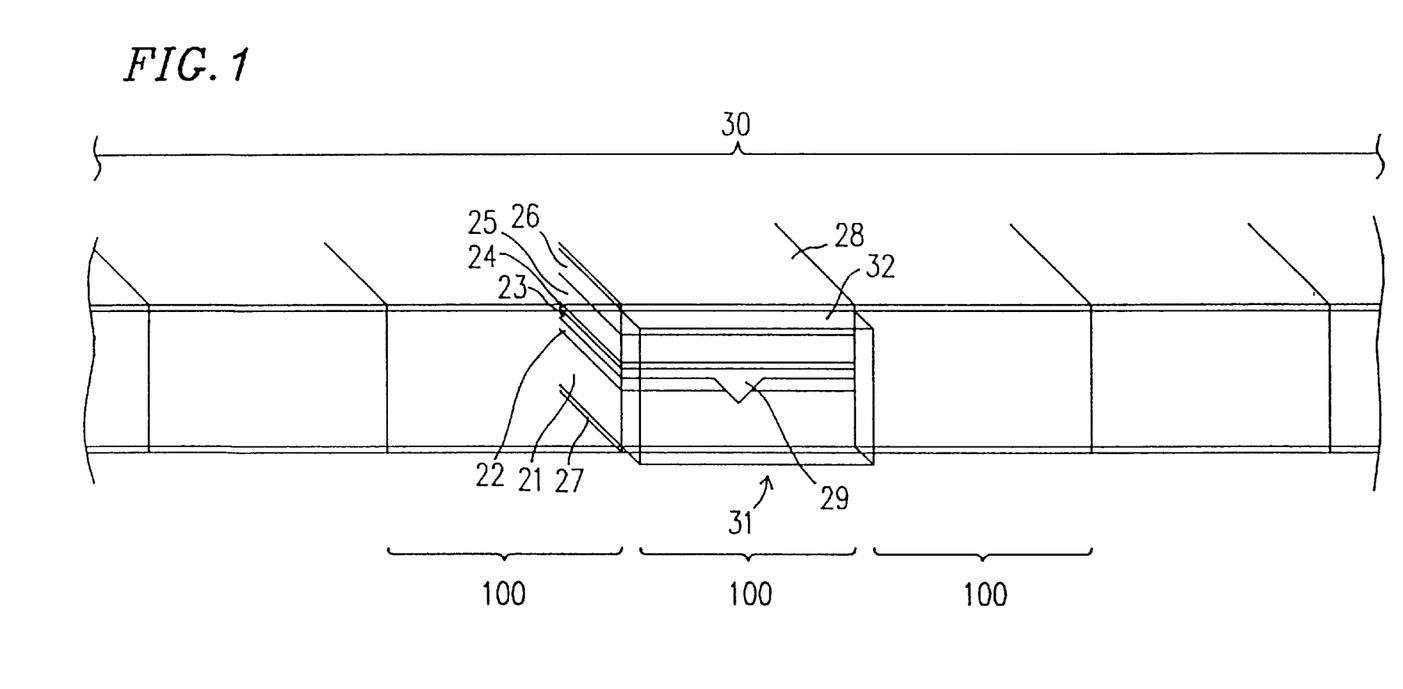
FIG. 1 is a perspective view of a bar wafer including a semiconductor laser device in Embodiment 1 according to the present invention.

FIG. 1 is a perspective view of a bar wafer 30 including semiconductor laser devices 100 of the present embodiment.

In this figure, each semiconductor laser device 100 has a layered structure including an n-type GaAs layer 22, a p-type $Al_{0.45}Ga_{0.55}As$ cladding layer 23, a p-type $Al_{0.14}Ga_{0.86}As$ active layer 24, an n-type $Al_{0.45}Ga_{0.55}As$ cladding layer 25, and an n-type GaAs cap layer 26 successively layered on a p-type GaAs substrate 21 in this order. A p-type electrode 27 is provided on a bottom surface of the substrate 21 and an n-type electrode 28 is provided on the cap layer 26. The cladding layer 23 has a stripe-shaped V-groove 29.

In an actual production process, a wafer having the above-mentioned structure is cleaved to a plurality of the bar wafers 30. A cleavage facet 31 of each bar wafer 30 corresponds to a light-emitting facet of each semiconductor laser device 100, and a reflection protective film 32 is provided only on the light-emitting facet 31.

The bar wafer 30 provided with the reflection protective films 32 is further divided into individual semiconductor laser devices 100. More specifically, the bar wafer 30 provided with the reflection protective films 32 on the cleavage facets 31 includes a plurality of semiconductor laser devices 100 in a row.

In the above-mentioned structure, an Al mole fraction of the active layer 24 is typically set in the range of about 0.13 to about 0.14, and Al mole fractions of the cladding layers 23 and 25 are set in the range of about 0.45 to about 0.6. Alternatively, the Al mole fractions can be set at arbitrary values, as long as the Al mole fractions of the cladding layers 23 and 25 are set to be higher than that of the active layer 24 (provided that the Al mole fractions of the respective layers 23 to 25 are set to be higher than 0).

The semiconductor laser device 100 has a V-channel substrate inner stripe (VSIS) type structure grown by a liquid crystal epitaxy (LPE) method. More specifically, the semiconductor laser device 100 can be produced as follows.

The n-type GaAs layer 22 having a thickness of about 1 $\mu$m is formed on the p-type GaAs substrate 21 by an LPE method. Then, the V-groove 29 is formed in the n-type GaAs layer 22 so as to reach the substrate 21 by photolithography and etching. The p-type cladding layer 23 having a thickness of about 0.2 $\mu$m in a portion other than that on the V-groove 29, the active layer 24 having a thickness of about 0.06 $\mu$m, the n-type cladding layer 25 having a thickness of about 1 $\mu$m, and the cap layer 26 having a thickness of about 50 $\mu$m are successively formed on the substrate 21 and the n-type GaAs layer 22 by the LPE method to obtain the layered structure including the active layer 24. Thereafter, the n-type electrode 28 and the p-type electrode 27, for example, made of Au—Zn and Au—Ge, are respectively formed on the top surface of the cap layer 26 and on the bottom surface of the substrate 21. An Au layer is formed on an uppermost surface of the n-type electrode 28 and an aluminum layer is formed on an uppermost surface of the p-type electrode 27. Furthermore, the wafer is cleaved in the vertical direction of the V-groove 29 at an interval of about 250 $\mu$m, whereby a plurality of the bar wafers 30 are obtained.

The reflection protective film 32 is formed on the cleavage facet 31 (which is to function as a light-emitting facet) of each bar wafer 30 by using silicon nitride as a material for the purpose of protecting the light-emitting facet and providing appropriate light reflectance thereto. The process of forming the reflection protective film 32 is described in detail below.

First, a plurality of the bar wafers 30 are placed on a tray so that the cleavage facets 31 face sideways and the tray is put in a plasma CVD apparatus. Then, the reflection protective film 32 made of silicon nitride is formed on each cleavage facet (light-emitting facet) 31 by an RF (radio-frequency) discharge plasma CVD method using silane ($SiH_4$) gas and ammonia ($NH_3$) gas. More specifically, the silicon nitride film with a thickness of about 230 nm is grown on each cleavage facet 31 by processing the bar wafers 30 for about 20 minutes under the condition of a substrate temperature of about 300° C., a flow rate of silane gas of about 100 sccm, a flow rate of ammonia gas of about 200 sccm, a pressure of about 1 Torr, and an RF electric power of about 30 W.

During this process, a silicon nitride film having a thickness of about 300 nm is grown on the surface of the n-type electrode 28 provided on the cap layer 26 and a silicon nitride film having a thickness of about 150 nm is grown on the surface of the p-type electrode 27 provided on the bottom surface of the substrate 21. These unwanted silicon nitride films grown on the electrodes 27 and 28 are removed by etching in the subsequent step, whereby the high quality semiconductor layer device 100 with the reflection protective films 32 formed only on the light-emitting facets 31 can be obtained. The reflection protective films 32 thus formed typically provide the light reflectance of about 30% to the light-emitting facets 31.

When a maskless dry etching method having anisotropic etching characteristics is employed for removing the unwanted silicon nitride films, it is not required to protect the light-emitting facet 31 with a mask. This will be further described below.

A dry etching method, i.e., a technique of dry etching various materials by using reactive ion etching has a number of advantages, compared with a wet etching method using a liquid etchant. Therefore, the dry etching method has been widely used for industrial purposes. According to the reactive ion etching method, anisotropic etching can be realized by selecting appropriate etching conditions. More specifically, reaction gas used for etching is accelerated only in the vertical direction with respect to an electrode surface generating plasma, whereby the reaction gas is allowed to etch only a plane parallel to the electrode surface without etching a plane vertical to the electrode surface. Because of this feature, the reactive ion etching method is utilized in a number of fields such as a process for production of silicon semiconductor wafers.

In the present embodiment, the unwanted silicon nitride films formed on the electrodes of the bar wafers 30 including a plurality of semiconductor laser devices 100 are removed by the above-mentioned dry etching, i.e., anisotropic etching. This enables only the unwanted silicon nitride films on the electrodes to be removed by etching. At this time, the silicon nitride films (reflection protective films) 32 formed on the light-emitting facets 31 are hardly etched away even without using a mask.

Figure 2:
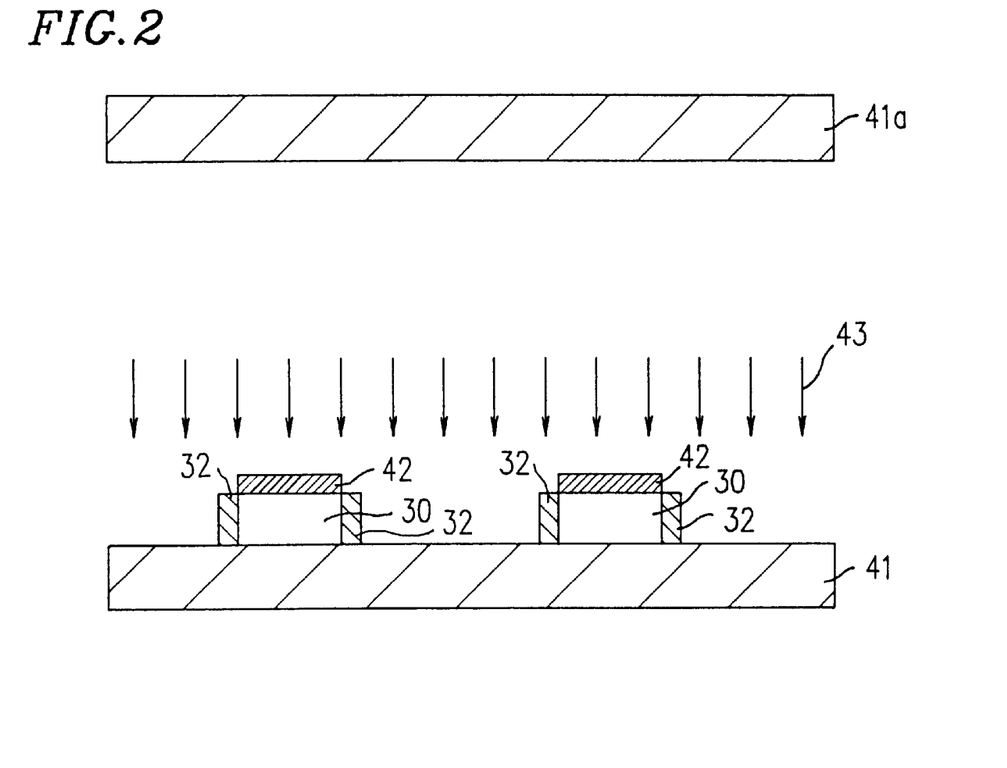
FIG. 2 is a cross-sectional view schematically illustrating a method for removing an unwanted reflection protective film in Embodiment 1 according to the present invention.

More specifically, as shown in FIG. 2, a plurality of bar wafers 30 each provided with silicon nitride films 32 and 42 by the above-mentioned growth process are placed on a lower electrode (reactive electrode) 41 of a reactive ion etching apparatus (dry etching apparatus) in such a manner that the n-type electrode on the cap layer faces an upper electrode 41a. Then, reactive ion etching (dry etching) is conducted using $CF_4$ gas and $O_2$ gas under the condition of a $CF_4$ gas flow rate of about 50 sccm, an $O_2$ gas flow rate of about 150 sccm, a gas pressure of about 0.1 Torr, and an RF electric power of about 100 W.

In the reactive ion etching apparatus used in this process, positive ions 43 of reaction gas used for etching are accelerated toward the lower electrode 41 (i.e., cathode). Thus, only the unwanted silicon nitride film 42 formed on the n-type electrode is removed by arranging the bar wafers 30 as described above. At this time, the silicon nitride films 32 formed on the light-emitting facets, which are to function as reflection protective films, are hardly etched away.

Under the above-mentioned etching condition, the Au layer formed on the uppermost surface of the n-type electrode is etched at a speed of $1/10$ or less of an etching speed of the silicon nitride film. Therefore, etching can easily be stopped after the removal of only the silicon nitride film 42 by using the Au layer as an etching stop layer. Furthermore, under this condition, only the unwanted silicon nitride film on the n-type electrode can be removed without fail by a dry etching process for about 3 minutes.

Then, the bar wafers 30 are turned upside down, and the unwanted silicon nitride film formed on each p-type electrode on the bottom surface of the substrate is similarly removed by dry etching. In this case, the aluminum layer formed on the uppermost surface of the p-type electrode is etched at a speed of $1/30$ or less of an etching speed of the silicon nitride film. Therefore, etching can easily be stopped after the removal of only the silicon nitride film by using the aluminum layer as an etching stop layer. Under the above-mentioned etching condition, only the unwanted silicon nitride film on the p-type electrode can be removed without fail by a dry etching process for about 1.5 minutes.

The silicon nitride film 32 on the light-emitting facet 31 is slightly etched away during the above-mentioned anisotropic dry etching conducted twice. However, the silicon nitride film 32 after etching typically has a thickness of about 210 nm which shows only a slight reduction as compared with the original thickness of about 230 nm.

The bar wafers 30 each provided with the reflection protective films 32 on the light-emitting facets by the above-mentioned process are divided into a plurality of chips, and these chips are individually mounted on stems. The life of the semiconductor laser device 100 formed by the production method of the present embodiment is 50,000 hours or longer. Thus, the semiconductor laser device 100 has reliability in terms of practical use. Furthermore, the production yield of the semiconductor laser device by the production method of the present embodiment improves by about 1.2 times the conventional method.

Embodiment 2

In the present embodiment, alumina is used as a material for a reflection protective film formed on a light-emitting facet of a semiconductor laser device. Unwanted reflection protective films adhering to the top surface and the bottom surface of the semiconductor laser device is removed by a dry etching method using $CF_4$ gas and $O_2$ gas.

Figure 3:
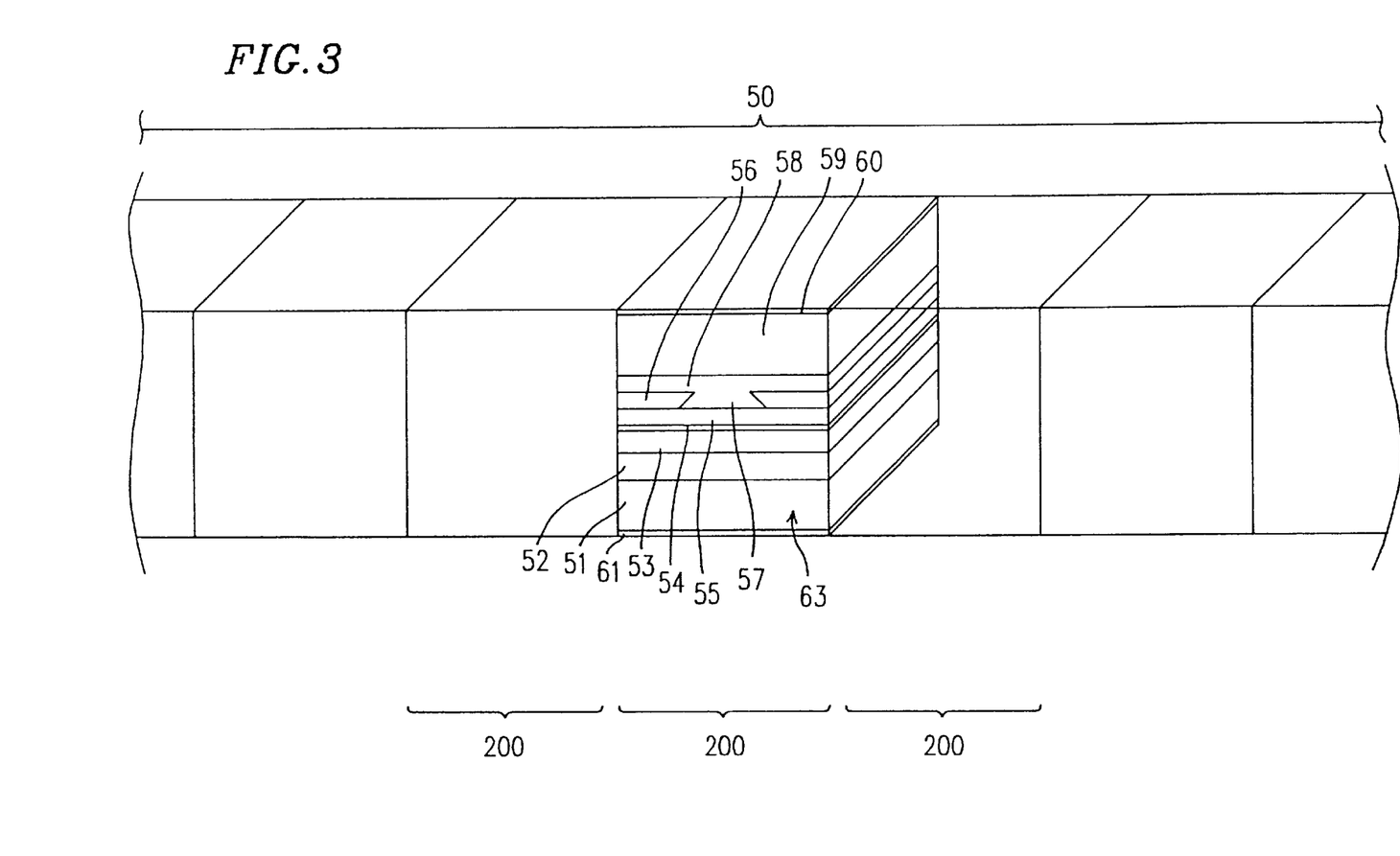
FIG. 3 is a perspective view of a bar wafer including a semiconductor laser device in Embodiment 2 according to the present invention.

FIG. 3 is a perspective view of a bar wafer 50 including semiconductor laser devices 200 of the present embodiment.

In this figure, each semiconductor laser device 200 has a layered structure including a buffer layer 52, a lower cladding layer 53, an active layer 54, an upper cladding layer 55, and a current blocking layer 56 successively layered on a substrate 51 in this order. The current blocking layer 56 has a stripe-shaped groove 57. Furthermore, another cladding layer 58 and a contact layer 59 are formed on the upper cladding layer 55 and the current blocking layer 56. A p-type electrode 60 is provided on the contact layer 59 and an n-type electrode 61 is provided on a bottom surface of the substrate 51.

In an actual production process, a wafer having the above-mentioned structure is cleaved to a plurality of the bar wafers 50. A cleavage facet 63 of each bar wafer 50 corresponds to a light-emitting facet of each semiconductor laser device 200, and a reflection protective film is provided only on the light-emitting facet 63.

The bar wafer 50 provided with the reflection protective films is further divided into individual semiconductor laser devices 200. More specifically, the bar wafer 50 provided with the reflection protective films on the cleavage facets 63 includes a plurality of semiconductor laser devices 200 in a row.

In the above-mentioned structure, an Al mole fraction of the active layer 54 is typically set in the range of about 0.13 to about 0.14. Al mole fractions of the cladding layers 53, 55, and 58 are typically set in the range of about 0.45 to about 0.6. Alternatively, the Al mole fractions can be set at arbitrary values, as long as the Al mole fractions of the cladding layers 53, 55, and 58 are set to be higher than that of the active layer 54 (provided that the Al mole fractions of the respective layers 53, 54, 55, and 58 are set to be higher than 0).

The semiconductor laser device 200 having the above-mentioned structure can be produced as follows.

First, a Se-doped n-type GaAs buffer layer 52 having a thickness of about 2 $\mu$m, a Se-doped n-type $Al_{0.5}Ga_{0.5}As$ lower cladding layer 53 having a thickness of about 1 $\mu$m, an $Al_{0.14}Ga_{0.86}As$ active layer 54 having a thickness of about 0.08 $\mu$m, a Zn-doped p-type $Al_{0.5}Ga_{0.5}As$ upper cladding layer 55 having a thickness of about 0.3 $\mu$m, and a Se-doped n-type GaAs current blocking layer 56 having a thickness of about 0.6 $\mu$m are successively grown on a substrate 51 made of n-type GaAs by a metal organic chemical vapor deposition (MOCVD) method. Then, a portion of the current blocking layer 56 is etched away to form a stripe-shaped groove 57, with an upper width of about 4 $\mu$m, so as to reach the upper cladding layer 55. Furthermore, a Mg-doped p-type $Al_{0.5}Ga_{0.5}As$ cladding layer 58, having a thickness of about 1 $\mu$m in a portion other than that on the stripe-shaped groove 57, and a Mg-doped p-type GaAs contact layer 59, having a thickness of about 50 $\mu$m, are successively grown on the upper cladding layer 55 and the current blocking layer 56 by an LPE method.

Furthermore, a layer having a high resistance which is formed in the vicinity of a surface of the contact layer 59 is removed by etching, mechanical polishing, or the like. Thereafter, an n-type electrode 60 and a p-type electrode 61, for example, made of Au—Zn and Au—Ge, are formed on the top surface of the contact layer 59 and the bottom surface of the substrate 51, respectively. A wafer is cleaved in the vertical direction of the stripe-shaped groove 57 at an interval of about 200 $\mu$m to obtain a plurality of the bar wafers 50.

A reflection protective film (not shown) is formed on the cleavage facet 63 (which is to function as a light-emitting facet) of each bar wafer 50 by using alumina as a material for the purpose of protecting the light-emitting facet and providing appropriate light reflectance thereto. The process of forming the reflection protective film is described in detail below.

First, a plurality of the bar wafers 50 are placed on a tray so that the cleavage facets 63 face sideways and the tray is put in a sputtering apparatus. Then, the reflection protective film made of alumina is formed on each cleavage facet (light-emitting facet) 63 by sputtering using an alumina target. More specifically, the alumina film with a thickness of about 240 nm is grown on each cleavage facet 63 by processing the bar wafers 50 for about 20 minutes under the condition of an argon gas pressure of 0.01 Torr and an RF electric power of about 50 W. In order to obtain an alumina film with uniform thickness, it is preferable that sputtering is conducted while the tray with the bar wafers 50 positioned thereon is rotated.

In the above-mentioned growth process, an alumina film having a thickness of about 400 nm is formed on the surface of the p-type electrode 60 provided on the contact layer 59 and an alumina film having a thickness of about 30 nm is formed on the surface of the n-type electrode 61 provided on the bottom surface of the substrate 51. These unwanted alumina films formed on the electrodes 60 and 61 are removed by the same dry etching step as that of Embodiment 1, whereby the high quality semiconductor laser device 200 with the reflection protective films formed only on the light-emitting facets 63 is obtained. The reflection protective films thus formed typically provide the light reflectance of about 30% to the light-emitting facets 63.

The etching condition for removing the unwanted alumina film is the same as that of Embodiment 1. In the present embodiment, the unwanted alumina film on the p-type electrode 60 can be removed by etching for about 4 minutes despite being relatively thick. On the other hand, the unwanted alumina film on the n-type electrode 61 is relatively thin, and therefore, this alumina film can be removed by etching for about 0.5 minutes.

The bar wafers 50 each provided with the reflection protective films on the light-emitting facets by the above-mentioned process are divided into a plurality of chips, and these chips are individually mounted on stems. The life of the semiconductor laser device 200 formed by the production method of the present embodiment is 50,000 hours or longer. Thus, the semiconductor laser device 200 has reliability in terms of practical use. Furthermore; the production yield of the semiconductor laser device by the production method of the present embodiment improves by about 1.2 times the yield of the conventional method.

Embodiment 3

In Embodiment 3, an apparatus 70 shown in FIG. 4 for producing a semiconductor laser device will be described. The apparatus 70 includes a combination of a plasma CVD apparatus for forming a reflection protective film made of silicon nitride on a light-emitting facet and a dry etching apparatus for removing an unwanted silicon nitride film formed on electrodes. The apparatus 70 enables a series of steps to be conducted automatically and continuously.

Figure 4:
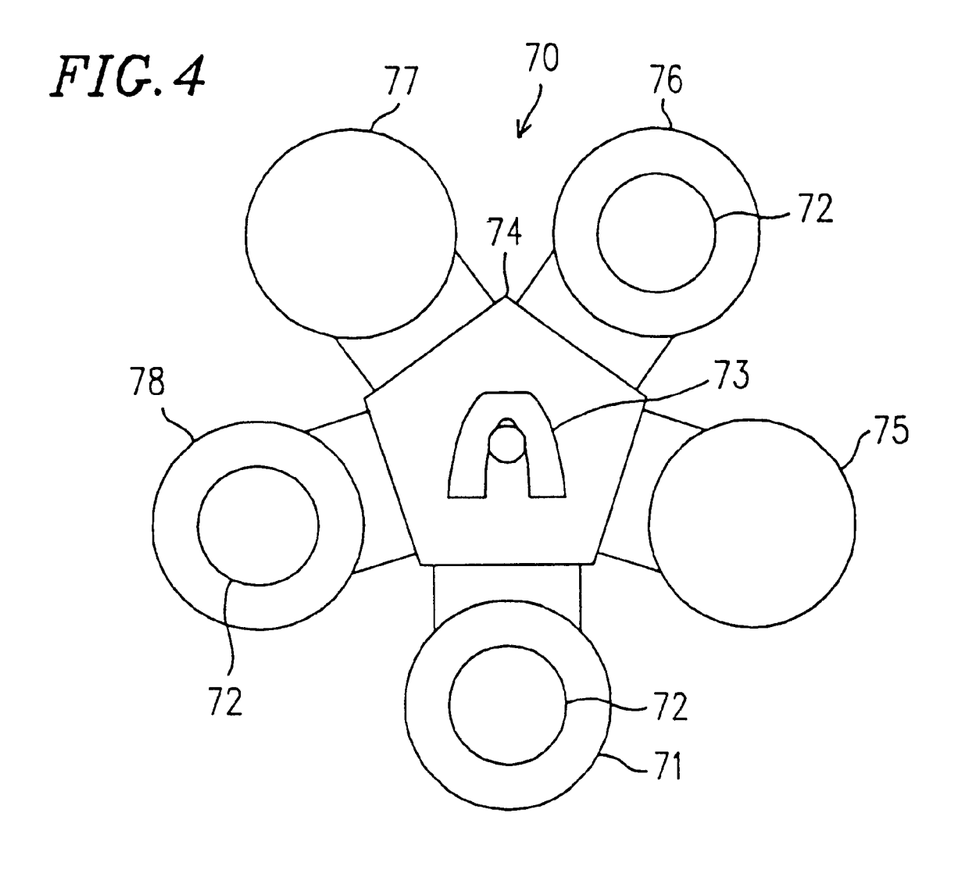
FIG. 4 is a plan view schematically showing a structure of an apparatus for producing a semiconductor laser device in Embodiment 3 according to the present invention.

FIG. 4 is a plan view schematically showing a structure of the apparatus 70 for producing a semiconductor laser device of the present invention.

A load lock chamber 71 is a space for setting a bar wafer in the apparatus 70 as described in the previous embodiment. A bar wafer is pre-heated in a pre-heating chamber 75. A reflection protective film is formed on a light-emitting facet of the bar wafer in a plasma CVD chamber 76 provided with a plasma CVD apparatus. An unwanted reflection protective film adhering to portions other than the light-emitting facets of the bar wafer, i.e., on the electrodes, is removed in a dry etching chamber 77 provided with a dry etching apparatus. Furthermore, the bar wafer is turned upside down in a sample inverting chamber 78 provided with a device inverting apparatus. A tray transferring robot 73 as a device carrier transfers the bar wafer among the load lock chamber 71, the pre-heating chamber 75, the plasma CVD chamber 76, the dry etching chamber 77, the device inverting chamber 78, and the dry etching chamber 77 in this order, respectively via a transferring chamber 74. The apparatus 70 for producing a semiconductor laser device is thus constructed, which includes the combination of the plasma CVD apparatus and the dry etching apparatus and enables a series of steps to be continuously conducted.

Hereinafter, the operation of the apparatus 70 for producing a semiconductor laser device will be described.

First, in the load lock chamber 71, a plurality of bar wafers formed by the methods, for example, described in Embodiments 1 and 2 are placed on the tray 72 and introduced into the apparatus 70. The tray transferring robot 73 transfers the tray 72 from the load lock chamber 71 to the pre-heating chamber 75 via the transferring chamber 74. In the pre-heating chamber 75, the bar wafers are heated at about 100° C. for about 10 minutes in vacuum, whereby unwanted material components such as water adhering to the surfaces of the bar wafers are removed.

Thereafter, the tray transferring robot 73 transfers the tray 72 from the pre-heating chamber 75 to the plasma CVD chamber 76 via the transferring chamber 74. In the plasma CVD chamber 76, reflection protective films made of silicon nitride are formed on cleavage facets (light-emitting facets) of the bar wafers by the method described in Embodiment 1. Then, the tray transferring robot 73 transfers the tray 72 from the plasma CVD chamber 76 to the dry etching chamber 77 via the transferring chamber 74. In the dry etching chamber 77, an unwanted silicon nitride film adhering to one of the electrodes is removed by the method described in Embodiment 1.

Then, the tray transferring robot 73 transfers the tray 72 from the dry etching chamber 77 to the sample inverting chamber 78 via the transferring chamber 74. In the sample inverting chamber 78, the bar wafers placed on the tray 72 are sandwiched between the tray 72 and another tray, and these two trays are turned upside down. Thereafter, the tray 72 positioned at the upper position is removed, whereby the bar wafers are turned upside down.

Furthermore, the tray transferring robot 73 transfers the bar wafers thus inverted in the sample inverting chamber 78 to the dry etching chamber 77 via the transferring chamber 74. In the dry etching chamber 77, an unwanted silicon nitride film adhering to the other electrode is removed by the method described in Embodiment 1.

After the above-mentioned steps, the tray transferring robot 73 transfers the tray 72 from the dry etching chamber 77 to the load lock chamber 71 via the transferring chamber 74. The bar wafers are taken out of the apparatus 70 after being cooled off. Thus, all the production steps of the semiconductor laser device described in Embodiment 1 can be conducted automatically and continuously. Alternatively, the reflection protective film described in Embodiment 2 can be formed by providing a sputtering chamber in place of the plasma CVD chamber 76.

The bar wafers with the reflection protective films formed on the cleavage facets (light-emitting facets) by the above-mentioned process are divided into a plurality of laser chips, and the chips are mounted on stems individually. The life of the semiconductor laser device produced by the method in the present embodiment is 50,000 hours or longer. Thus, the semiconductor laser device has reliability in terms of practical use.

Furthermore, the apparatus 70 enables the respective steps including the formation of the reflection protective films and the removal of the unwanted reflection protective films to be conducted continuously in vacuum. Therefore, the production yield of the semiconductor laser device improves by about 1.4 times the yield of the conventional method. Furthermore, compared with the conventional method, the time required for conducting the above-mentioned process is shortened to about ⅕. The improvement of yield and the substantial reduction of production time enable high-quality semiconductor laser devices used in optical pickups for CD players or MD players to be mass-produced at a low cost. As a result, such semiconductor laser devices can come into wide use.

As described above, according to the present invention, unlike the conventional technique, the formation of the reflection protective films on the light-emitting facets and the removal of the unwanted reflection protective films can be conducted without damaging the light-emitting facets and causing the unwanted oxide layers to be formed. This prevents the reliability of semiconductor laser devices to be produced from decreasing and improves the production yield thereof. Furthermore, the production process can be easily automated.

Still furthermore, the apparatus for producing a semiconductor laser device of the present invention substantially shortens the time required for forming the reflection protective films on the light-emitting facets and removing the unwanted reflection protective films. This enables high quality semiconductor laser devices used in optical pickups for CD players and MD players to be mass-produced at a low cost.

As described previously, the reflection protective films produced in accordance with the aforementioned embodiments of the present invention typically have the light reflectance of about 30%. Alternatively, by appropriately setting the process parameters at different values, the reflection protective film having a different value of the light reflectance can be formed in accordance with the present invention.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. An apparatus for producing a semiconductor laser device, comprising:

a formation section forming a reflection protective film on a light-emitting facet of a semiconductor laser device provided on a first tray;

a dry etching section removing an unwanted reflection protective film formed on a portion other than the light-emitting facet by an etching technique;

a device inverting section comprising a second tray for sandwiching the semiconductor laser device between the first tray and the second tray, wherein the semiconductor laser device is provided on the second tray by turning the semiconductor laser device and removing the first tray from the semiconductor laser device; and a device transferring section transferring the semiconductor laser device among the formation section, the etching section, and the device inverting section in a predetermined order.

2. The apparatus of claim 1, wherein the etching section comprises a reactive ion inlet port coupled to a source of $CF_4$ and $O_2$ carrier gases, and the reactive ion inlet port accelerates reactive ions carried by the $CF_4$ and $O_2$ carrier gases in a vertical direction.

3. The apparatus of claim 1, wherein the etching section comprises a reactive ion inlet coupling to a source of $CF_4$ and $O_2$ carrier gases, and the source of $CF_4$ and $O_2$ carrier gases provides a $CH_4$ gas flow rate of 50 sccm and an $O_2$ gas flow rate of 150 sccm.

4. The apparatus of claim 1 wherein the etching section comprises a reactive ion inlet coupling to a source of $CF_4$ and $O_2$ carrier gases, and the source of $CF_4$ and $O_2$ carrier gases has a gas pressure of 0.1 Torr.

5. The apparatus of claim 1, wherein the etching section comprises a reactive ion inlet coupling to a source of $CF_4$ and $O_2$ carrier gases, and an RF electric power of about 100 W is applied to generate reactive ions for the reactive ion inlet port.

* * * * *